(12) United States Patent
Bandyopadhyay et al.

(10) Patent No.: US 7,800,447 B2
(45) Date of Patent: Sep. 21, 2010

(54) OPERATIONAL AMPLIFIER WITH IMPROVED CURRENT MONITORING AND SCALABLE OUTPUT

(75) Inventors: Abhishek Bandyopadhyay, Woburn, MA (US); Khiem Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 85 days.

(21) Appl. No.: 12/173,703

(22) Filed: Jul. 15, 2008

(65) Prior Publication Data

US 2009/0102551 A1  Apr. 23, 2009

Related U.S. Application Data

(60) Provisional application No. 60/999,450, filed on Oct. 18, 2007.

(51) Int. Cl.
*H03F 3/26* (2006.01)
(52) U.S. Cl. ...................................... 330/267
(58) Field of Classification Search ............ 330/255, 330/267
See application file for complete search history.

(56) References Cited

U.S. PATENT DOCUMENTS 6,542,033 B2 *  4/2003  Maejima .................. 330/261

OTHER PUBLICATIONS de Langen, et al., "Compact Low-Voltage Power-Efficient Operational Amplifier Cells for VLSI," *IEEE Journal of Solid-State Circuits*, 33:10, 1482-1496 (1998).

Eschauzier et al., "A Programmable 1.5 V CMOS Class-AB Operational Amplifier with Hybrid Nested Miller Compensation for 120 dB Gain and 6 MHz UGF," *IEEE Transactions of Solid-State Circuits*, 29:12, 1497-1504 (1994).

Ferri et al., SP 24.1: A 1.3V Op/amp in Standard 0.7 μm CMOS with Constant $g_m$ and Rail-to-Rail Input and Output Stages, *IEEE International Solid-State Conference* (1996).

Hogervorst, et al., "A Compact Power-Efficient 3 V CMOS Rail-to-Rail Input/Output Operational Amplifier for VLSI Cell Libraries," *IEEE Journal of Solid-State Circuits*, 29:12, 1505-1513 (1994).

Monticelli, "A Quad CMOS Single-Supply Op Amp with Rail-to-Rail Output Swing," *IEEE Journal of Solid-State Circuits*, 21:6, 1026-1034 (1986).

Wen-Chung, et al., "Digital-Compatible High-Performance Operational Amplifier with Rail-to-Rail Input and Output Ranges," *IEEE Journal of Solid-State Circuits*, 29:12, 63-66 (1994).

(Continued)

*Primary Examiner*—Robert Pascal
*Assistant Examiner*—Khiem D Nguyen
(74) *Attorney, Agent, or Firm*—Knobbe, Martens, Olson & Bear LLP

(57) ABSTRACT

A low-power, low-voltage feedback class AB operational amplifier is disclosed. The minimum supply voltage is one gate-source voltage and two saturation voltages. Currents on the output p-type and n-type transistors are monitored as part of the feedback loop control. Accurate monitoring is achieved by connecting current monitors directly to the corresponding voltage rail. Additional output stages may be selectively connected to the primary output stage to dynamically adjust to changes source conditions. Thus by connecting the appropriate number and type of additional output stages, continuous time adaptive power supply compensation is achieved. Both single ended and differential topologies are described.

11 Claims, 9 Drawing Sheets

OTHER PUBLICATIONS

Renire, et al., "Parallel Feedforward Class AB Control Circuits for Low-Voltage Bipolar Rail-to-Rail Output Stages of Operational Amplifiers," *Proc. Analog Integrated Circ. Signal*, vol. 8, pp. 37-48 (1995).

* cited by examiner

OPERATIONAL AMPLIFIER WITH IMPROVED CURRENT MONITORING AND SCALABLE OUTPUT

CROSS-REFERENCE TO RELATED APPLICATION

The present application claims the benefit, under 35 U.S.C. §119(e), of U.S. Provisional Application Ser. No. 60/999,450, filed Oct. 18, 2007, entitled "Low Voltage Low Power Class AB Operational Amplifier," which application is hereby incorporated herein by reference.

BACKGROUND

I. Field of the Invention

The invention relates generally to the field of amplifiers and more particularly to low voltage class AB operational amplifiers.

II. Description of Related Art

Nowadays, electronic accessories are a ubiquitous part of modern day life. Users of portable phones, organizers, and dedicated music and videos players demand electronics offering high performance, convenient size, and sufficient battery life.

A key component of many electronic accessories are the low-power signal processors and audio coder-decoders (CODECS), which are usually battery driven. Low-power, high performance operation is desirable for extending battery life. These goals may be achieved, in part, by using a low voltage supply (less than 2V) for memory, signal processors, and the CODECs used in electronic accessories.

Sometimes CODECs must provide 1 or 2 V RMS (root mean square) outputs to external loads. In this case, the internal amplifiers must operate over a larger supply voltage range, typically 3.6 V. While line outs have a standard impedance of 10 kΩ, the audio amplifier must provide considerably larger currents to headphones which typically have an input impedance of only 32Ω.

Because portable audio and video players are increasingly being used with high fidelity speaker systems, such as in docking stations, automobiles, and home theaters, users have increased expectations for signal to noise ratio (SNR) and total harmonic distortion (THD) performance. For example, headphones may have signal-to-noise ratios of about 70 dB, but on a high-fidelity audio system, amplifier noise (SNR) and distortion (THD) in excess of 100 dB may be noticeable. The player's amplifier, a fundamental aspect of the design, must be able to drive various kinds of loads while dissipating very low power.

Operational-amplifiers (op-amps) have long played a fundamental role in the design of electronic devices of all types. Performance tradeoffs are approached differently by different designs, while occasionally, new technologies and approaches allow performance enhancement in all design considerations.

Class AB op-amps, represent a tradeoff between the inefficient class A design, and the highly distorting class B design. The class A designs have a maximum theoretical operational efficiency of 25%, while the maximum theoretical efficiency of a class B device is 78.5%. Class AB designs generally fall somewhere between the two. Low-voltage op-amp designs require a minimum supply voltage of one gate-sources voltage and two saturation voltages.

A feedback class AB op-amp attempts to monitor and feedback the currents on the output stage of the amplifier. Previous low-voltage designs have failed to accurately monitor the amplifier's output currents with the accuracy needed to achieve SNR and THD performance of 100 dB or better.

SUMMARY

An apparatus and method are provided for a low-power, low-voltage amplifier with improved signal to noise ratio (SNR) and total harmonic distortion (THD).

In some aspects, embodiments relate to an amplifier having an input stage, output stage and monitoring stage. The output stage has a first transistor with an input terminal and a second transistor with an input terminal. The monitoring stage has a first current sensing transistor with an input terminal and a first common terminal. The first current sensing transistor's input terminal is connected to the first transistor's input terminal and the first common terminal of the first current sensing transistor is connected to a first voltage rail. The monitoring stage also has a second current sensing transistor with an input terminal and a first common terminal. The second current sensing transistor's input terminal is connected to the second transistor's input terminal and the first common terminal of the second current sensing transistor is connected to a second voltage rail.

In another aspect, embodiments relate to a method having a determining step and a connecting step. In the determining step it is determined whether a tap voltage corresponds to an enable state or a disable state. The tap voltage is related to a source voltage for an amplifier. In the connecting step, an additional output stage is connected to a primary output stage of the amplifier when the determining asserts the tap voltage corresponds to the enable state.

In yet another aspect, embodiments relate to an operational amplifier comprising a primary output stage, a plurality of comparators, and a plurality of additional output stages. Each of the plurality of comparators is adapted to output a control signal in response to comparing a reference voltage to a tap voltage. Each additional output stage is adapted to connect to or disconnect from the primary output stage in response to the control signal of a corresponding comparator among the plurality of comparators.

BRIEF DESCRIPTION OF DRAWINGS

The invention and embodiments thereof will be better understood when the following detailed description is read in conjunction with the accompanying figures. In the figures, elements are not necessarily drawn to scale. In general, like elements appearing in multiple figures are identified by a like reference designation. In the drawings.

DETAILED DESCRIPTION

The inventors have appreciated the need for operational amplifiers with excellent power, SNR, and THD performance, such that they are suitable for portable audio players connected to high fidelity amplifiers and speaker systems. Some embodiments include a low-voltage feedback class AB output stage operational amplifier. With proper component selection and biasing, embodiments may provide SNR and THD performance better than 100 dB. Embodiments offer superior monitoring of the output stage currents, improving the accuracy of the feedback loop.

Also disclosed is a method of continuous time adaptive supply voltage compensation. Design tradeoffs must be made when using a single output stage for an op-amp used under varying voltage supply conditions. By selectively connecting additional output stages to the primary output stage, excellent performance can be achieved from the minimum supply voltage to the maximum supply voltage at the lowest power.

Figure 1:
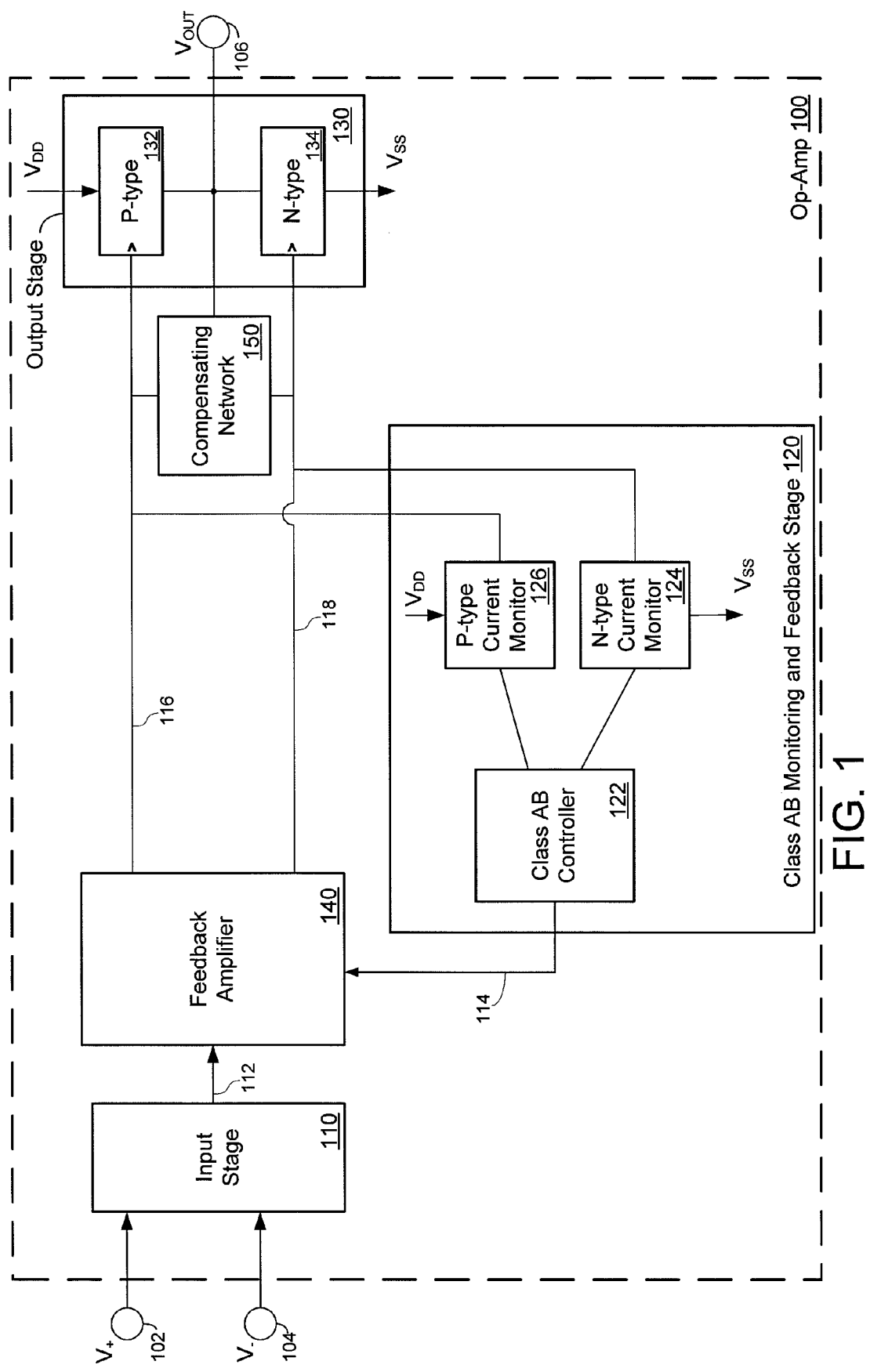
FIG. 1 is a block diagram showing the operation of a feedback class AB operational amplifier.

An embodiment is the low-voltage feedback class AB output stage operational amplifier 100 illustrated as a simplified block diagram in FIG. 1. Op-amp 100 has an input stage 110, an output stage 130, a class AB monitoring and feedback stage 120, a feedback amplifier stage 140, and a compensating network 150. Op-amp 100 is powered by a high-voltage rail, $V_{DD}$, and a low voltage rail, $V_{SS}$. The difference between $V_{DD}$ and $V_{SS}$ is referred to as the supply voltage.

The input stage 110 provides a low noise, high input impedance, differential input. The input stage receives input signals $V_+$ and $V_-$ on terminals 102 and 104, respectively. The input stage 110 is connected via connection 112 to the class AB feedback amplifier stage 140.

The feedback amplifier stage 140 amplifies the input signal received from the input stage 110. The amplified signal is output to the output stage 130 via connections 116 and 118 and monitored by the class AB monitoring and feedback stage 120. The feedback amplifier stage 140 receives feedback from the monitoring and feedback stage 120 via connection 114.

The output stage 130 drives the output signal $V_{out}$, on terminal 106 of the operational amplifier 100. In some embodiments, the output stage comprises a pair of output drivers 132 and 134. In some embodiments, the output driver 132 is a p-type transistor, and the output driver 134 is an n-type transistor. In an example embodiment, the p-type transistor is an PMOS transistor, and the n-type transistor is an NMOS transistor, however, any type of complementary transistor pair may be used. The input terminal (gate for FETs) for transistors 132 and 134, indicated by ">" in FIG. 1, are connected to current monitors 126 and 124, respectively, and to compensating network 150. PMOS refers to a p-type MOSFET (metal-oxide-semiconductor field-effect transistor). Similarly, NMOS refers to an n-type MOSFET. FET refers to a more general class of field-effect transistors including, for example, MOSFETs, JFETs (Junction Field-Effect Transistor), and MESFETs (Metal-Semiconductor Field-Effect Transistor).

The compensating network 150 supports the output stage 130. In some embodiments, the compensating network 150 may be considered part of output stage 130.

The monitoring stage 120 accurately measures the output currents for the output drivers, imposes the class AB operating rule, and completes a feedback loop with feedback amplifier 140. The monitoring stage comprises current monitors 124 and 126, and class AB controller 122.

Because current monitors 124 and 126 are connected directly to $V_{DD}$ and $V_{SS}$ respectively, without any intervening transistors, the output currents of the current monitors accurately reproduce the currents at the output stage 130 of op-amp 100. Accurately monitoring the output currents provides feedback for the amplification of the input signals, $V_+$ and $V_-$. The class AB operation is enforced by the feedback configuration of op-amp 100.

Figure 2:
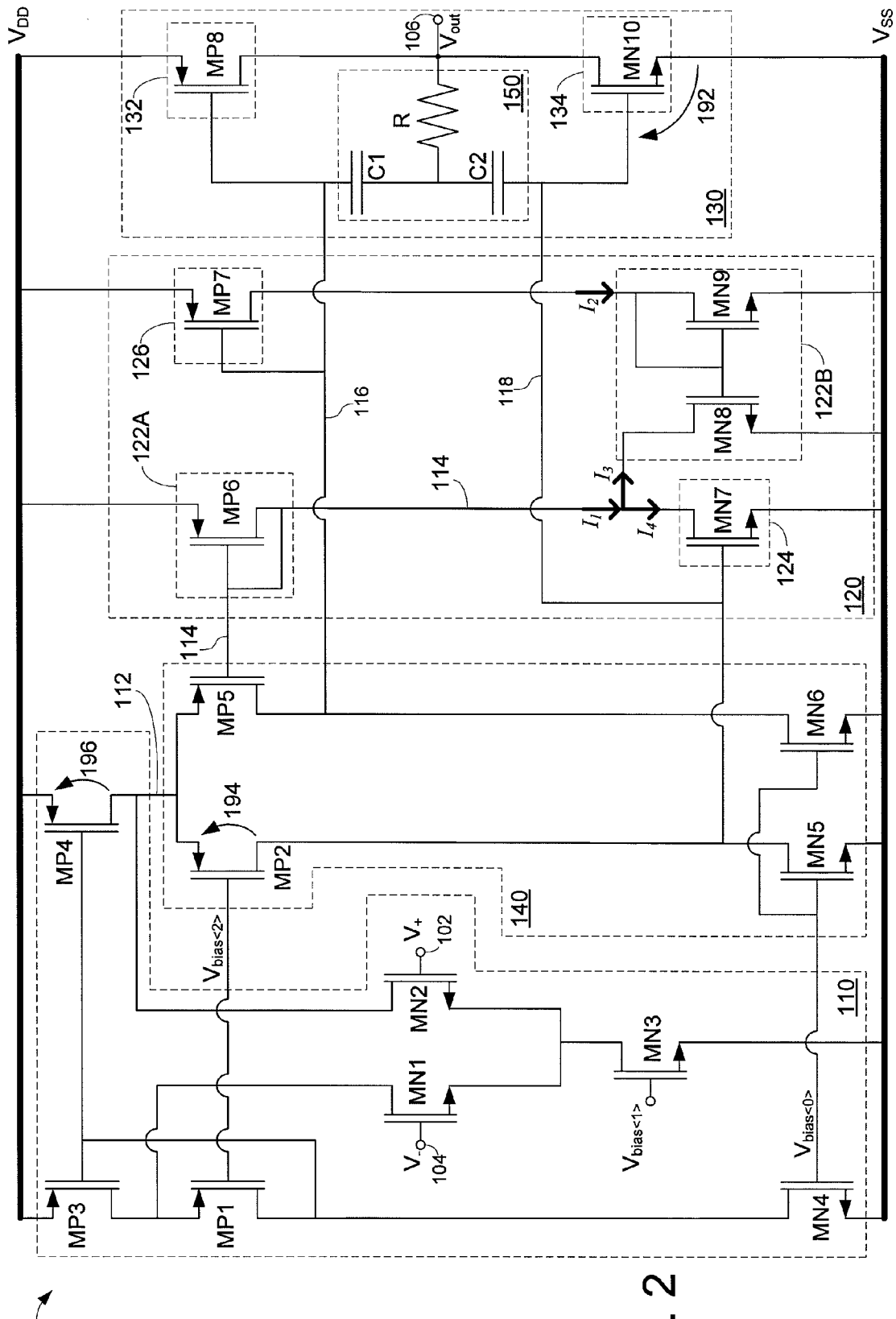
FIG. 2 is a schematic of a feedback class AB operational amplifier according to some embodiments.

Having provided a block diagram of an embodiment, a further embodiment of op-amp 100 is shown schematically in the circuit diagram of FIG. 2. In FIG. 2, the circuit components of input stage 110, monitoring stage 120, output stage 130, feedback amplifier stage 140, and compensating network 150 of the op-amp 100 are clearly identified. Note that the class AB controller 122 (FIG. 1) is outlined as elements 122A and 122B for purposes of clarity. The circuit comprises voltage rails $V_{DD}$ and $V_{SS}$, p-type transistors MP1-MP8, n-type transistors MN1-MN10, capacitors C1 and C2, and resistor R. A biasing network may be used to provide bias voltages $V_{bias<0>}$, $V_{bias<1>}$, and $V_{bias<2>}$. Transistors are shown using PMOS and NMOS symbols, however, any appropriate type of transistor may be used. For example, embodiments are envisioned using bipolar junction transistors (BJTs).

The op-amp 100 has many features. For example, the minimum voltage of operation is one gate to source voltage 192 and two saturation voltages 194 and 196. The monitoring stage 120 provides accurate control for class AB operation. Accurate control for class AB operation results in high performance and low distortion. The circuit can operate over a wide supply voltage range and is capable of driving resistive and capacitive loads. It can also be manufactured within a very small footprint.

The input stage 110 comprises p-type transistors MP1, MP3, and MP4 and n-type transistors MN1-MN4. An n-type differential input stage is formed by MN1 and MN2 which take inputs $V_-$ and $V_+$ at there input terminals, respectively.

Transistor MN3, has a voltage, $V_{bias<1>}$, applied to its input terminal. This transistor establishes a bias current for operation of the device. Voltage $V_{bias<1>}$ may be generated by a biasing network (not shown), or any other suitable way and may adapt to varying circuit conditions.

The feedback amplifier stage 140 comprises p-type transistors MP2 and MP5, and n-type transistors MN5 and MN6. The feedback amplifier stage receives an input signal via connection 112, under proper operating conditions, voltage $V_{bias<2>}$, received on the gate of MP2 is replicated at the gate of MP5, connection 114.

The monitoring stage 120 comprises current monitors 124 and 126 and class AB controller 122 (FIG. 1). Class AB controller 122 comprises current source 122A and current mirror 122B.

Current monitor 126 is embodied by transistor MP7. The input terminal of MP7 is connected directly to the input terminal of output driver 132 via connection 116, which is embodied as transistor MP8. The source (transistor terminal with an arrow) of MP7 is directly connected, with no intermediate transistor, to the voltage rail $V_{DD}$. The drain terminal is connected to current mirror 122B. The current $I_2$ through MP7 is proportional to the current through transistor MP8.

Here and throughout, the terms source, drain, and gate terminals may be used with specific reference to a MOSFET embodiment, however, in embodiments where other technologies are used, connections may be made using the corresponding input and common terminals.

Current monitor 124 is embodied by transistor MN7. The input terminal of MN7 is connected directly to the input terminal of output driver 134 via connection 118, which is embodied as transistor MN10. The source terminal of MN7 is directly connected, with no intermediate transistor, to the voltage rail $V_{SS}$. In the illustrated embodiment, the drain terminal is connected to the class AB controller current source 122A and current mirror 122B, via connection 114.

Current source 122A of the class AB controller 122 (FIG. 1) is embodied by transistor MP6. The source of MP6 is connected directly to $V_{DD}$. The gate and drain are shorted, and both are connected to the input terminal of transistor MP5 of the feedback amplifier stage 140 via connection 114. The impedance looking in to the drain of MP6 is $1/g_{MP6}$, where $g_{MP6}$ is a transconductance. Under normal operation, due to feedback, the voltage of connection 114 follows the input terminal voltage of MP2, namely, $V_{bias<2>}$. The bias voltage $V_{bias<2>}$ as presented to the resistance $1/g_{MP6}$ establishes the constant current, $I_1$.

Current mirror 122B of the class AB controller 122 (FIG. 1) is embodied by transistors MN8 and MN9. Current mirror 122B receives control current $I_2$ and replicates it as current $I_3$. At the same time, the current $I_4$ through MN7 is proportional to the current through transistor MN10. The relationships required between the monitoring currents $I_1$, $I_2$, $I_3$, and $I_4$ provide a feedback mechanism that insures proper performance of the operational amplifier. Specifically, under normal operation of the feedback class AB op-amp:

$$I_1 = I_2 + I_4.$$

Stated another way, the output currents through the output drivers 132 and 134 sum to a constant. This is insured by the connection of the transistors and by Kirchoff's current law. The class AB feedback loop formed by the feedback amplifier 140 and the monitoring and feedback stage 120 controls the output currents.

Output stage 130 comprises transistors MP8 and MN10 capacitors C1 and C2, and resistor R form the compensating network 150. The output voltage, $V_{out}$, of op-amp 100 is provided on terminal 106. The push-pull output configuration allows the output to source and sink currents to the load.

One of the challenges of operating and designing audio CODECs is meeting requirements to operate over a wide range of supply voltages. Traditional selection of the output transistors is a tradeoff between performance and distortion. When the supply increases, the output stage must have more drive capability since the output signal may swing over a larger range. If the op-amp were designed for the highest voltage of operation, however, it would be very inefficient at lower operating voltages where the extra current is not used to drive the output. If, on the other hand, the output stage is designed for the lowest voltage, distortion increases when the op-amp is used at its highest supply voltage, because it may lack sufficient drive capability.

Figure 3:
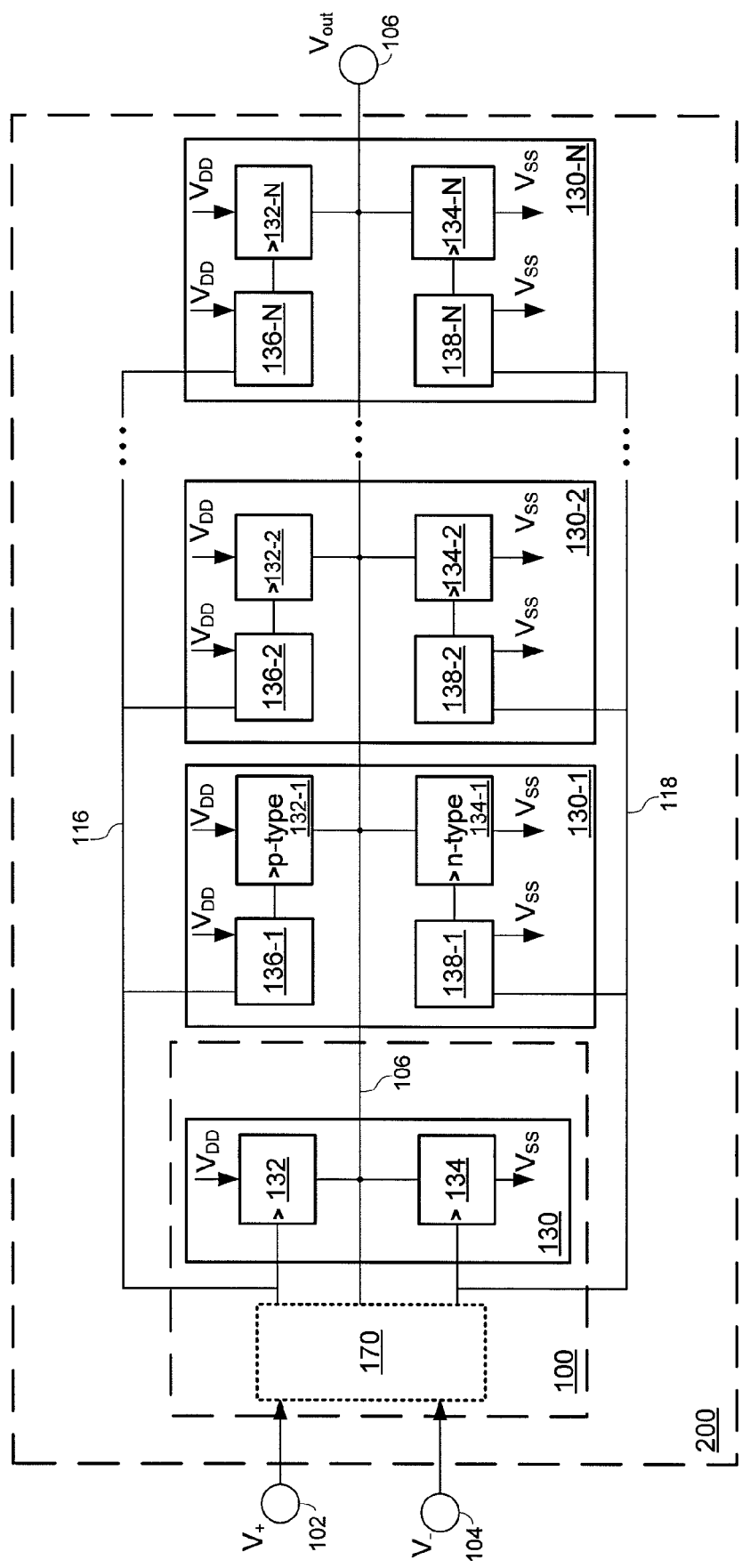
FIG. 3 is a block diagram showing a low-voltage class AB op-amp with continuous time adaptive supply voltage compensation.

FIG. 3 illustrates an embodiment of op-amp 100 having additional output stages that may be selectively enabled and disabled in response to changes in the supply voltage. The output stage 130 of op-amp 100 is shown explicitly and for clarity the remaining components are collected into component box 170. Embodiments featuring additional output stages are referred to as op-amp 200. Embodiments of op-amp 200 where the output stages 130-1 to 130-N are connected to an op-amp different than op-amp 100 are also envisioned. The use of op-amp 100 as the foundation of op-amp 200 is purely illustrative, and not limiting. Additional output stages 130-1 to 130-N may be added to any suitable amplifier.

Continuous time adaptive power supply compensation may be achieved by such a design, allowing for good performance and efficiency at low and high supply voltages, as well as intermediate values.

Op-amp 200 is shown with additional output stages 130-1 to 130-N for implementing continuous time adaptive supply voltage compensation. Like output stage 130, each additional output stage comprises a pair of output drivers 132-1 to 132-N and 134-1 to 134-N. In some embodiments, these are p-type transistors (output drivers 132-1 to 132-N) and n-type transistors (output drivers 134-1 to 134-N).

Output stages may be selectively enabled/disabled by controls 136-1 to 136-N, and controls 138-1 to 138-N. The controls for a given stage include or are connected to a monitor that determines if the stage should be enabled or disabled. In some embodiments, the monitor is a voltage monitor and makes the determination based on a voltage associated with the supply voltage. For example, if the output stage 130-1 is presently disabled, the voltage monitor associated with output stage 130-1 determines if the corresponding voltage has passed an enable threshold. If so, the controls 136-1 and 138-1 enter an enabled state. If, on the other hand, the output stage 130-1 is presently enabled, the voltage monitor associated with output stage 130-1 determines if the corresponding voltage has passed a disable threshold. If so, the controls 136-1 and 138-1 enter a disabled state. Output stages 130-2 to 130-N may operate similarly, however, different parameters may be monitored to determine the state of each stage. When an output stage 130-1, for example, is enabled, the input terminal of output driver 132-1 is connected to connection 116. This allows the monitoring stage 120 to also monitor the current through output driver 132-1. Like output driver 132, output driver 132-1 is connected to $V_{DD}$ and to the output terminal 106.

In a similar way, output driver 134 is connected to connection 118 when a stage 130-1 is enabled.

When additional output driver 130-1 is disabled, controls 136-1 and 138-1 connect the input terminals of 132-1 and 134-1 to the voltage rails $V_{DD}$ and $V_{SS}$, respectively. This connection turns off the extra output drivers and minimizes the leakage current flowing through them.

Figure 4:
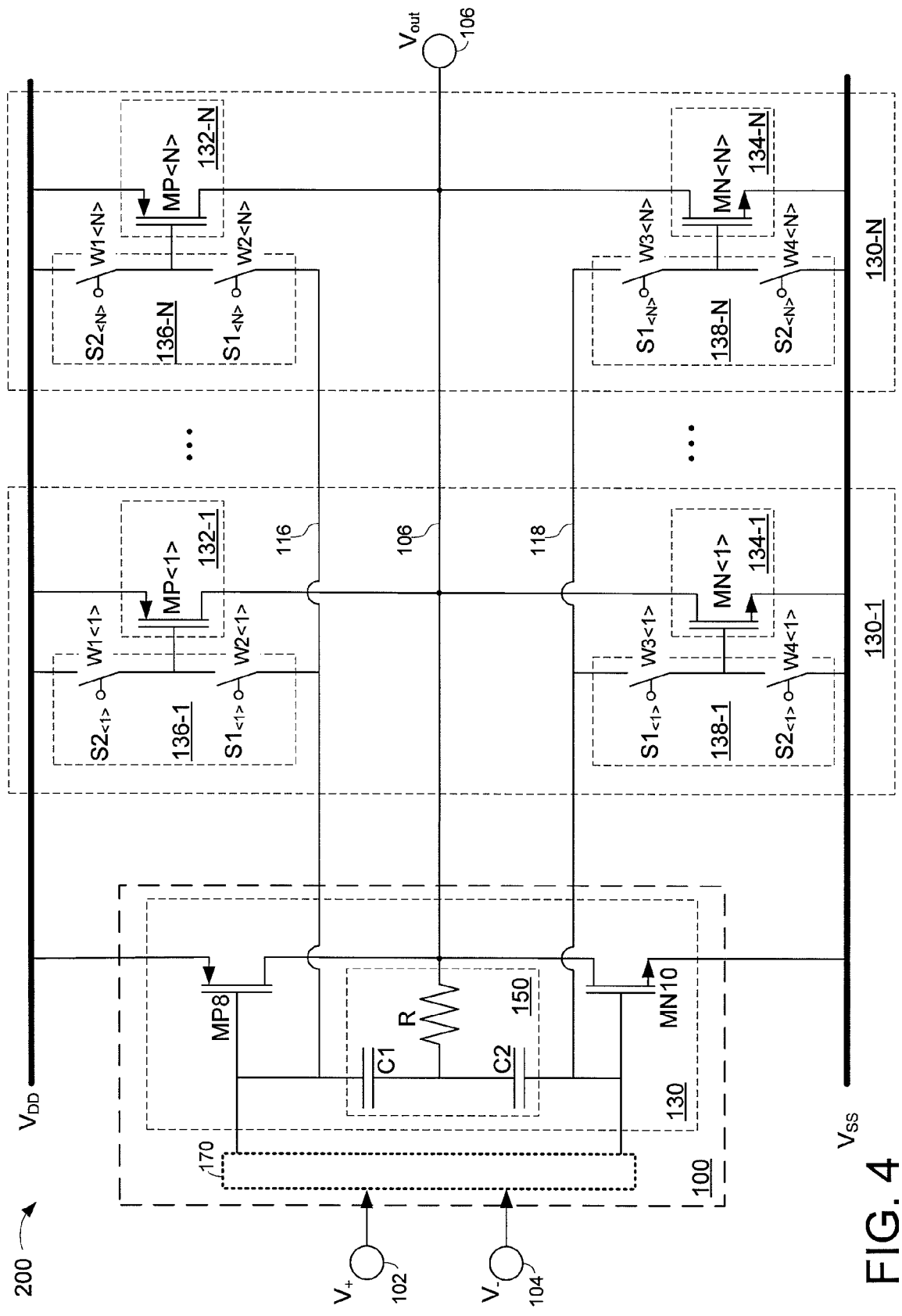
FIG. 4 is a schematic of a low-voltage class AB op-amp with continuous time adaptive supply voltage compensation.

FIG. 4 is a circuit diagram showing an embodiment of op-amp 200. The embodiment features N additional output stages. The circuit to the left of additional output stage 130-1 is identical to the embodiment of op-amp 100 (FIG. 2), however any appropriate op-amp may be connected to the additional output stages. Output drivers 132-1 to 132-N are shown as PMOS transistors MP<1> to MP<N> and output drivers 134-1 to 134-N are shown as NMOS transistors MN<1> to MN<N>. However, any suitable transistor technology may be used.

Each of controls 136-1 to 136-N, and 138-1 to 138-N take two control signals. In additional output stage 130-1 for example, control 136-1 receives control signals $S1_{<1>}$ and $S2_{<1>}$ at internal switches W2<1> and W1<1>, respectively. Control 138-1 also receives the control signals $S1_{<1>}$ and $S2_{<1>}$ to switches W3<1> and W4<1>, respectively. In some embodiments, $S1_{<1>}$ and $S2_{<1>}$ are binary signals having the property.

$$S1_{<1>} = \sim S2_{<1>}.$$

Here "~" is used to indicate that $S2_{<1>}$ is the complement of $S1_{<1>}$. Thus when internal switches W2<1> and W3<1> are closed, internal switches W1<1> and W4<1> are open, and vice versa. The remaining additional output stages may operate in a similar way.

For example, when additional output stage 130-1 is in an enabled state, internal switches W2<1> and W3<1> are closed and internal switches W1<1> and W4<1> are open connecting the input terminal of MP<1> and MN<1> to the input terminal of MP8 and MN10, respectively. In embodiments where the additional output stages are connected to op-amp 100, closing internal switches W2<2> and W3<1> also connects MP<1> and MN<1> to the current monitors 126 and 124 (FIG. 1) respectively. In this way the current through the additional output stages may be monitored by the monitoring and feedback stage 120 (FIG. 1). The drain terminals of MP<1> and MN<1> are connected to the drain terminal of MP8 and MN10, respectively, and the output terminal 106. By connecting output stage 130-1 to output stage 130, the width parameter of the output driver transistors is increased, increasing the effective drive capability of the output stage 130.

Figure 5:
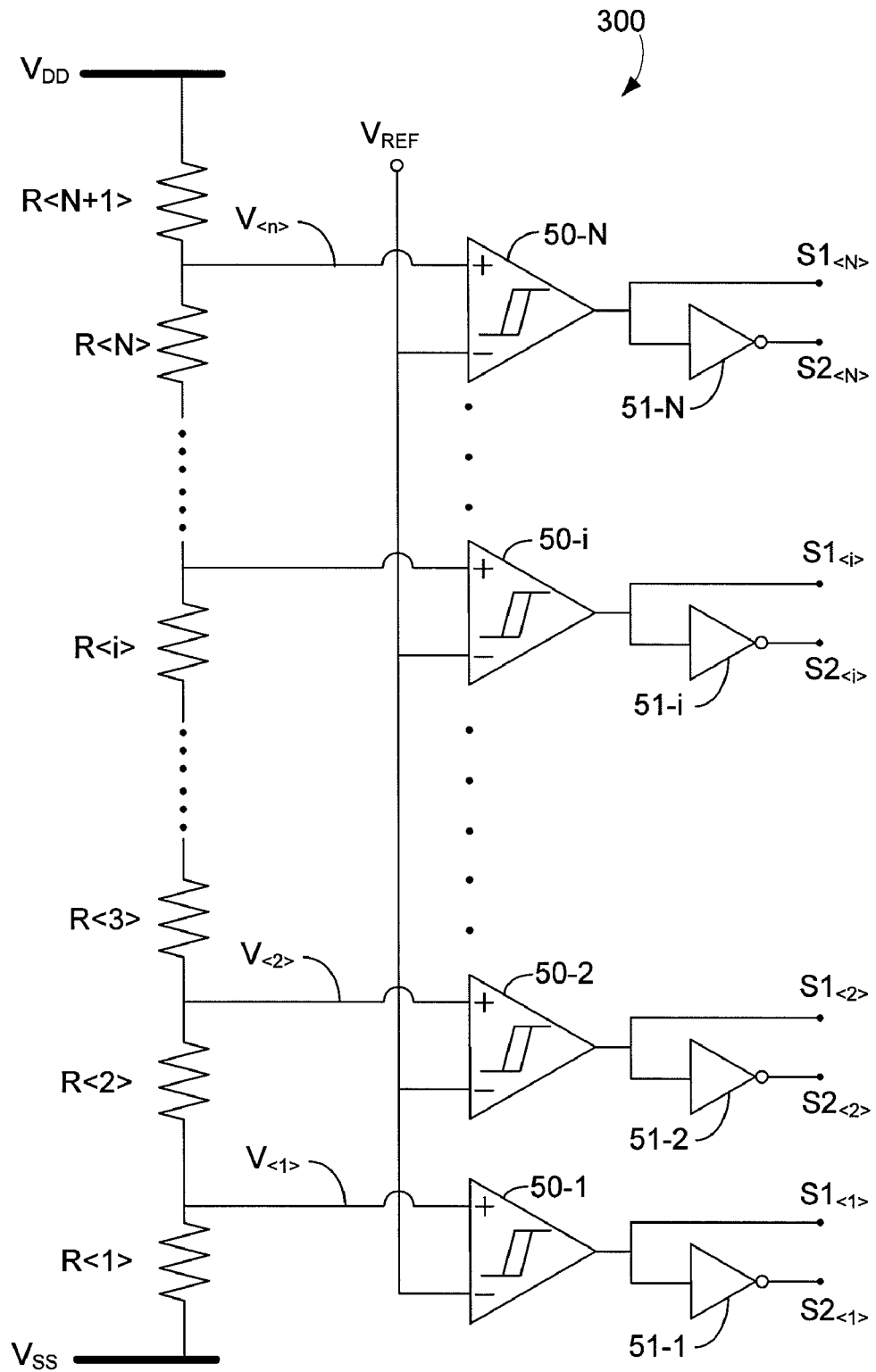
FIG. 5 is a supply voltage monitoring scheme according to some embodiments.

The switch control signals $S1_{<1>}$ to $S1_{<N>}$, and $S2_{<1>}$ to $S2_{<N>}$ may be generated in any suitable way. A supply voltage monitor 300 comprising N voltage monitors is illustrated in FIG. 5. The monitored signals, $V_{<1>}$ to $V_{<N>}$, are tapped from series connected resistors R<1> to R<N+1> by comparators 50-1 to 50-N. The series connected resistors R<1> to R<N+1> are connected together and to the voltage rails $V_{DD}$ and $V_{SS}$ as shown. The supply voltage is represented by the difference between $V_{DD}$ and $V_{SS}$. According to an embodiment of the supply voltage monitor 300 where $V_{DD}$ is greater than $V_{SS}$, the tap voltages $V_{<1>}$ to $V_{<N>}$, have the following relationship:

$$V_{<1>} \leq V_{<2>} \leq \ldots \leq V_{<N-1>} \leq V_{<N>}$$

Each comparator 50-1 to 50-N receives a reference voltage, $V_{REF}$, to compare the corresponding tap voltage to. The reference voltage may be generated in any suitable way, but should not vary with the supply voltage. In some embodiments, a bandgap reference is used. Very little power is drawn from the reference voltage source by the supply voltage monitors 300 since it is only connected to high impedance inputs.

The output of comparators 50-1 to 50-N generate output signals signal $S1_{<1>}$ to $S1_{<N>}$, respectively. To generate output signals signal $S2_{<1>}$ to $S2_{<N>}$, each respective output $S1_{<1>}$ to $S1_{<N>}$ is connected to a respective inverter 51-1 to 51-N. According to an embodiment where the resistors R<1> to R<N+1> all have non-zero resistances and comparators 50-1 to 50-N all behave in the same manner. As the supply voltage exceeds $V_{REF}$, the additional output stage 130-1 to 130-N are enabled reverse sequentially (130-N first, followed by 130-(N−1)).

In some embodiments, the comparators 50-1 to 50-N are have hysteresis as illustrated symbolically. This allows for an enable threshold that is different than the disable threshold. One benefit of a comparator with hysteresis is that small variations in the supply voltage will not cause the comparator to quickly change output states.

Figure 6A:
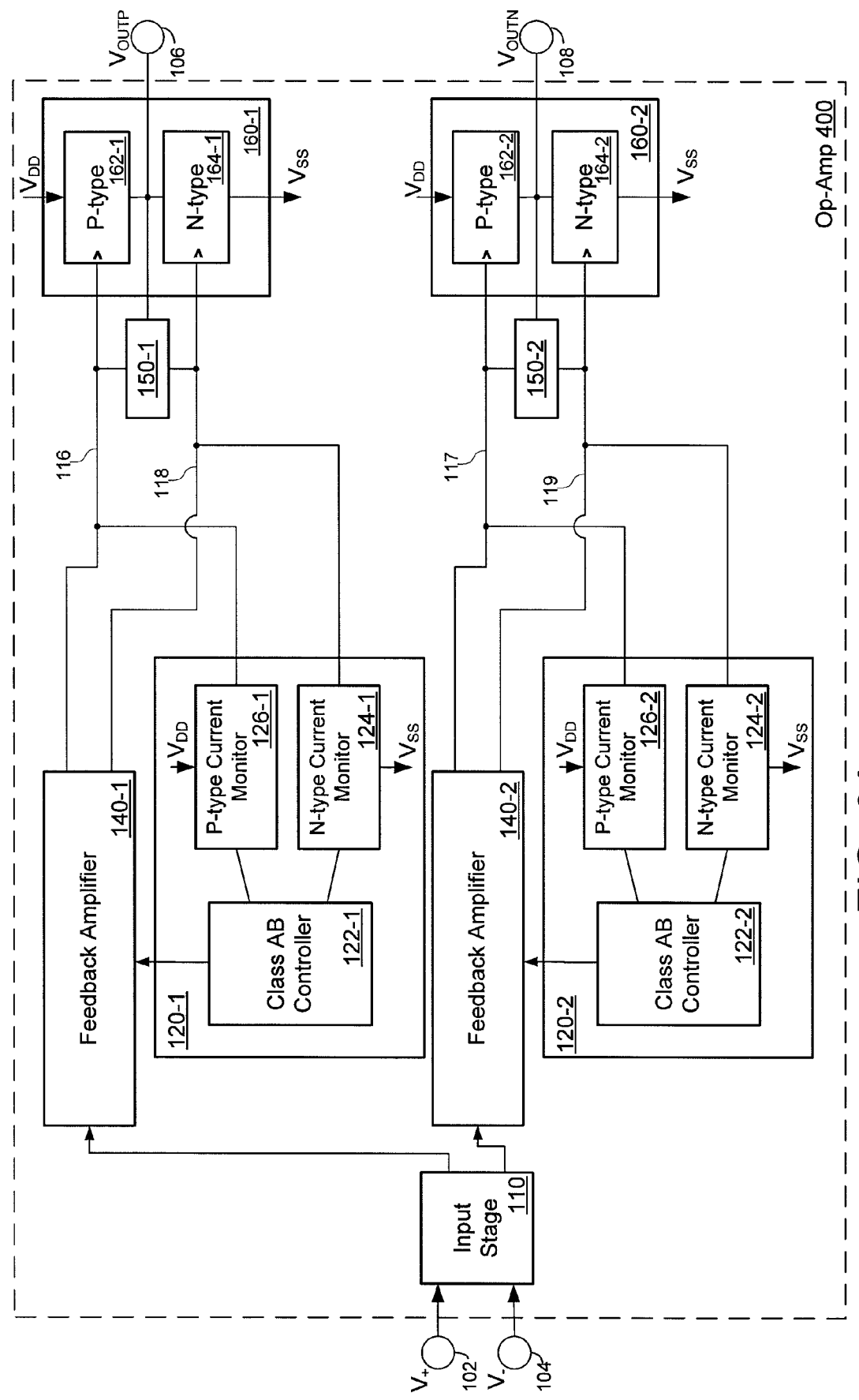
FIG. 6A is a block diagram showing the operation of a differential feedback class AB operational amplifier.
Figure 6B:
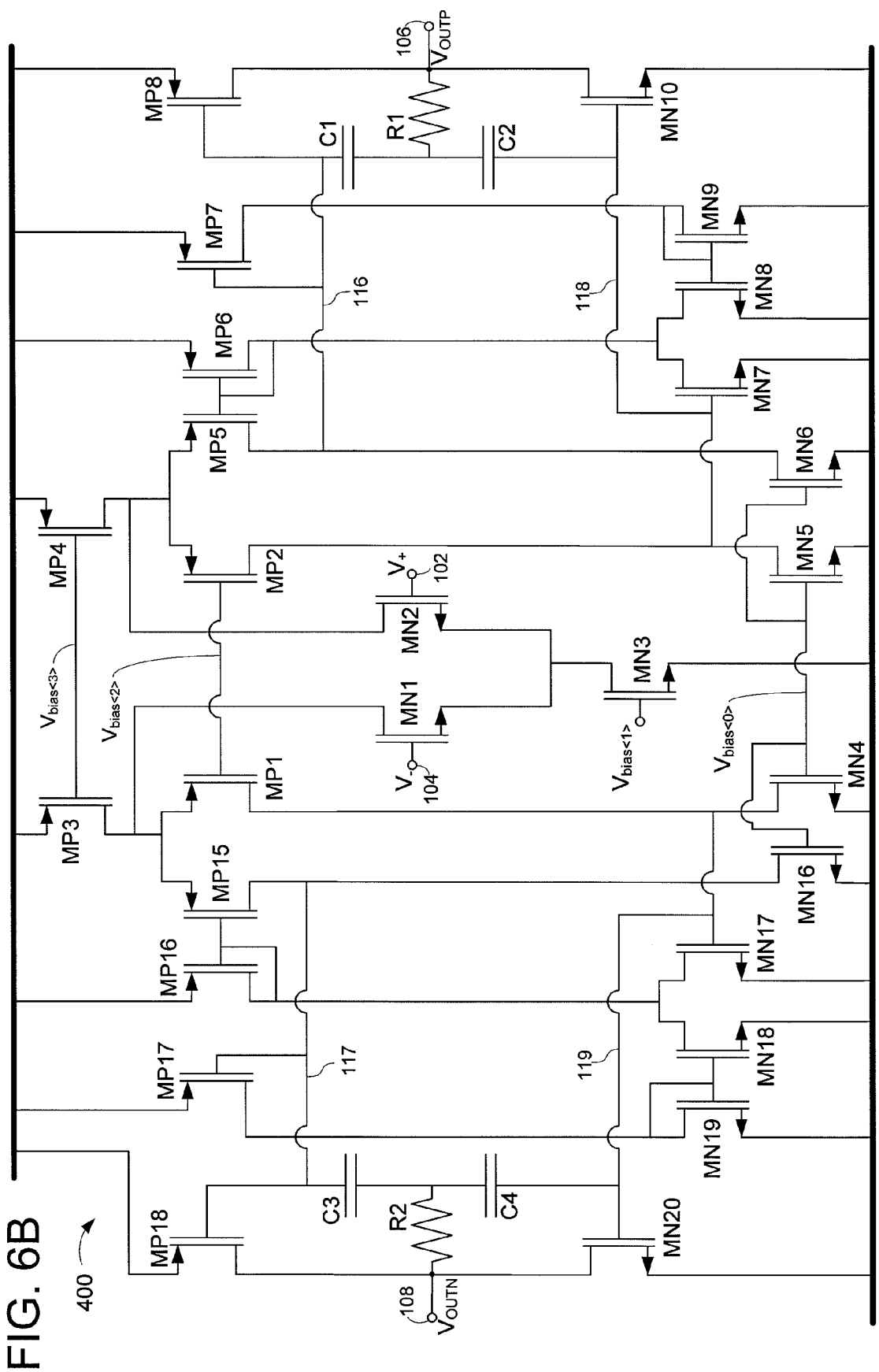
FIG. 6B is a schematic of a differential feedback class AB operational amplifier.
Figure 6C:
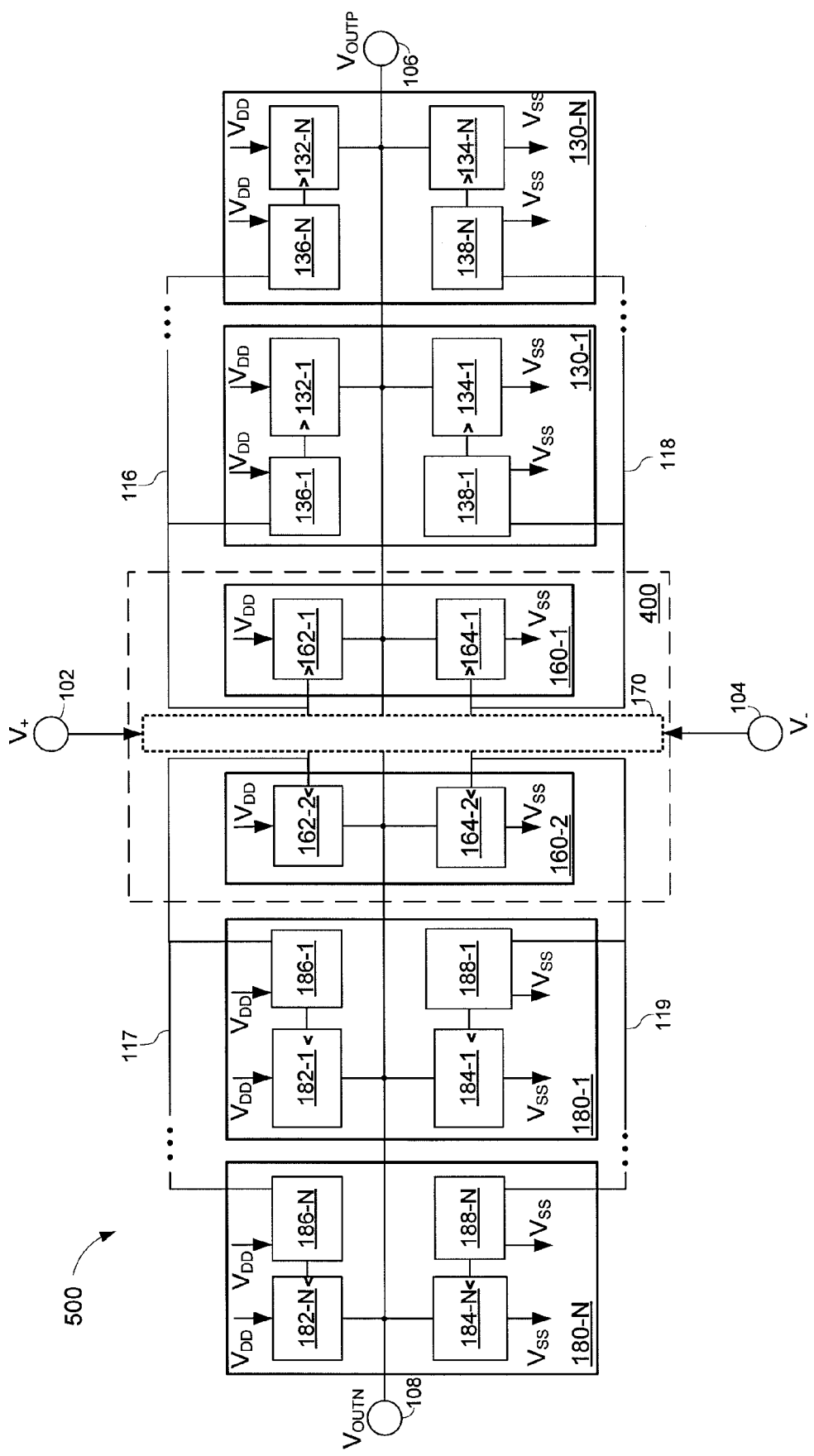
FIG. 6C is a block diagram showing a differential low-voltage class AB operational amplifier with continuous time adaptive supply voltage compensation.

The op-amp 100 and op-amp 200 have thus far been illustrated as single ended amplifiers. FIG. 6A-C illustrate a differential embodiment of op-amp 100 and op-amp 200. The differential version of op-amp 100 is illustrated in FIG. 6A as op-amp 400 which is similar to FIG. 1 for the single ended version. Differential feedback class AB op-amp 400 has an input stage 110 that provides signals to feedback amplifier stages 140-1 and 140-2. As with the single ended version feedback amplifier stages 140-1 and 140-2 are connected to corresponding output stages 160-1 and 160-2, corresponding compensating networks 150-1 and 150-2, and corresponding class AB monitoring feedback stages 120-1 and 120-2, respectively. (Now that output stages are numbered 160-1 and 160-2 to avoid confusion with additional outputs states 130-1 to 130-N in FIGS. 3-4.) Op-amp 400 provides two output signals, $V_{OUTP}$ and $V_{OUTN}$ on output terminals 106 and 108, respectively.

FIG. 6B is a schematic of the differential version of the feedback class AB operational amplifier according to some embodiments. Input signals $V_+$ and $V_-$ are received on terminals 102 and 104, respectively. The output, $V_{OUTP}$, is generated by the circuitry to the right of the input stage. The output signal $V_{OUTN}$ is generated by the circuitry to the left of the input stage. In the present embodiment of op-amp 400 the op-amp is completely symmetrical about the input stage. In comparison with op-amp 100 as illustrated in FIG. 2, notice that op-amp 400 does not include a connection between the gate of MP3 and the drain of MP1. Rather, the connection of the gates of MP3 and MP4 are held at bias voltage $V_{bias<3>}$. Voltage $V_{bias<3>}$ may be generated by any suitable means.

FIG. 6C is a block diagram showing a differential low voltage class AB op-amp 500 with continuous time adaptive supply voltage compensation. The output stages 160-1 and 160-2 of op-amp 400 are shown explicitly and for clarity and the remaining components are represented by component box 170. Here additional output stages 130-1 to 130-N provide additional drive capability to output stage 160-1, providing output voltage $V_{OUTP}$. Similarly, additional output stages 180-1 to 180-N provide additional drive capability to output stage 160-2, providing output voltage $V_{OUTP}$. Like the additional output stages 130-1 to 130-N, additional output states 180-1 to 180-N have output drivers 182-1 to 182-N and 184-1 to 184-N, and controls 186-1 to 186-N and 188-1 to 188-N. The controls selectively connect the corresponding output drivers to the output drivers 162-2 and 164-2 of output state 160-2 via connections 117 and 119, respectively.

Figure 7:
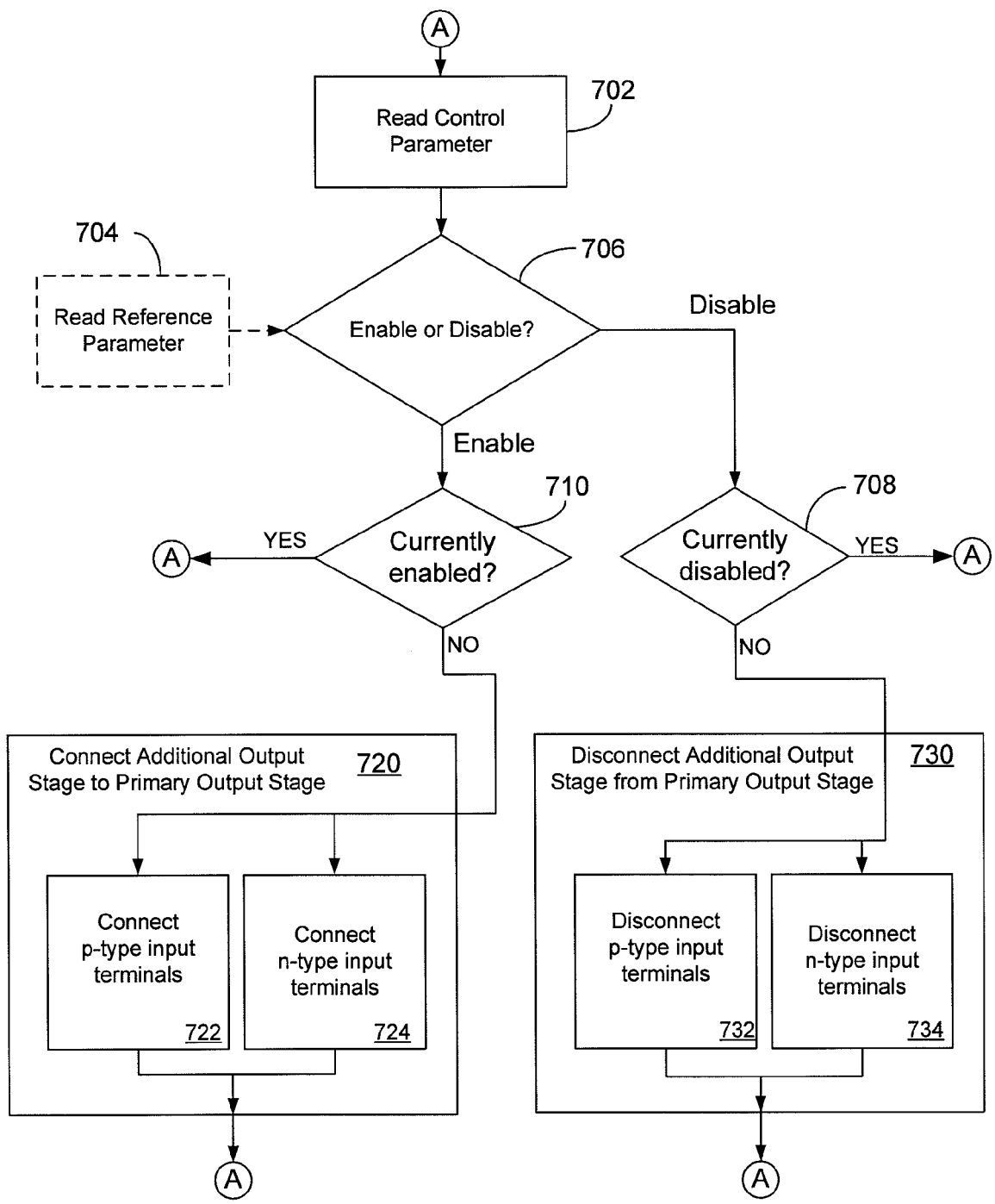
FIG. 7 is a flow chart illustrating a method of performing continuous time adaptive supply voltage compensation.

Having described embodiments of single ended op-amp 200 and differential op-amp 500 a method for operating an amplifier with continuous time adaptive power supply compensation is now detailed with reference to FIG. 7. Each additional output stage may be controlled according to the method. The method begins with step 702 where a control parameter is read. In some embodiments the control parameter may be a voltage, such a the tap voltage $V_{<i>}$ in the embodiment of the voltage monitor in FIG. 5.

In some embodiments, the control parameter and a reference parameter are compared either directly or indirectly by step 706. A reference parameter, if necessary, may be acquired in step 704. In some embodiments, the reference parameter is a reference voltage, such as $V_{REF}$ in the embodiment shown in FIG. 5. In general, step 706 makes a decision as to the enablement or disablement of the additional output stage under consideration. Any appropriate decision logic may be used. If step 706 determines that the additional output stage should be disabled, flow continues to step 708. For example, the logic may be: if the top voltage $V_{<i>}$ exceeds the reference voltage, $V_{REF}$, enable the additional output stage, else, disable the additional output stage. If step 706 determines that the additional output stage should be enabled, flow continues to step 710.

When flow proceeds from step 706 to step 710, it is determined if the current state is the enabled state. If so, no change in state is necessary and flow returns to the start, via "A." If however, the current state is not the enabled state, a state change is needed and flow continues to step 720.

In step 720 the additional output stage is connected. In some embodiments, connecting the additional output stage comprises steps 722 and 724. In step 722 the input terminal of the p-type output transistor of the additional output stage is connected to the p-type output transistor of the primary output stage. For example, in the embodiment of op-amp 200 show in FIG. 4, closing switch W2<1> and insuring switch W1<1> is open will connect the p-type output transistor MP<1> of the additional output stage 130-1 to the input terminal of p-type transistor MP8 of the primary output stage 130.

Similarly, in step 724 the input terminal of the n-type output transistor of the additional output stage is connected to the n-type output transistor of the primary output stage. For example, in the embodiment of op-amp 200 show in FIG. 4, closing switch W3<1> and insuring switch W4<1> is open will connect the n-type output transistor MN<1> of the additional output stage 130-1 to the input terminal of n-type transistor MN10 of the primary output stage 130.

After having connected the additional output stage to the primary output stage in step 730, the process returns to the start, via "A."

If in step 706 it is determined that the additional output stage is to be disable, flow continues to step 708 where it is determined if the current state is the disable state. If so, no change in state is necessary and flow returns to the start, via "A." If however, the current state is not the disable state, a state change is needed and flow continues to step 730.

In step 730 the additional output stage is disconnected. In some embodiments, disconnecting the additional output stage comprises steps 732 and 734. Continuing the example of op-amp 200 in FIG. 4 with reference to additional output stage 130-1, the switches W1<1> to W4<1> are simply in the opposite state as they were for the enabled state. Specifically W1<1> and W4<1> are closed, and W2<1> and W3<1> are now opened. This turns off the additional output stage 130-1, disconnects the input terminals of MP<1> from MP8, and disconnects the input terminals of MN<1> from MN10.

After having disconnecting the additional output stage to the primary output stage in step 730, the process returns to the start, via "A."

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An amplifier comprising:
   an input stage;
   an output stage comprising:
      a first transistor having a first input terminal; and
      a second transistor having a second input terminal;
   a monitoring stage comprising:
      a first current sensing transistor having a third input terminal and a first common terminal, wherein the third input terminal is connected to the first input terminal and the first common terminal is connected to a first voltage rail; and
      a second current sensing transistor having an fourth input terminal and a second common terminal, wherein the fourth input terminal is connected to the second input terminal and the second common terminal is connected to a second voltage rail;
   wherein the output stage is a first output stage;
   wherein the amplifier further comprises a second output stage, the second output stage comprising:
      a third transistor having a fifth input terminal;
      a fourth transistor having a sixth input terminal;
      a voltage monitor;
      a first switch switchable between at least a first state and a second state, the first switch adapted to connect the fifth input terminal to the first input terminal in the first state, and to disconnect the same in the second state; and
      a second switch switchable between at least a third state and a fourth state, the second switch adapted to connect the sixth input terminal to the second input terminal in the third state, and to disconnect the same in the fourth state.

2. The amplifier of claim 1, wherein the first transistor is p-type, and the second transistor is n-type.

3. The amplifier of claim 2, wherein:
   the first transistor has a third common terminal and the second transistor has a fourth common terminal, and the fourth common terminal is connected to the third common terminal.

4. The amplifier of claim 2, wherein:
   the first current sensing transistor is a p-type MOSFET;
   the second current sensing transistor is an n-type MOSFET;
   the first transistor is a p-type MOSFET; and
   the second transistor is an n-type MOSFET.

5. The amplifier of claim 2, wherein:
   the first current sensing transistor has a fifth common terminal; and
   the monitoring stage further comprises a current mirror having a source current input and a regulated current input;
   wherein:
      the source current input is connected to the fifth common terminal; and
      the current mirror is adapted to reproduce a first current passing through the source current input as a second current passing through the regulated current input.

6. The amplifier of claim 5, wherein:
   the second current sensing transistor has a sixth common terminal; and
   the monitoring stage further comprises a current source having an output, the output carrying a third current and connected to the regulated current input and to the sixth common terminal.

7. The amplifier of claim 1 wherein:
   the voltage monitor determines if a voltage corresponds to an enable state or a disable state;
   the first switch adopts the first state when the voltage monitor determines the voltage corresponds to the enable state; and
   the second switch adopts the third state when the voltage monitor determines the voltage corresponds to the enable state.

8. The amplifier of claim 1, wherein:
   the first transistor has a third common terminal;
   the second transistor has a fourth common terminal, the fourth common terminal being connected to the third common terminal of the first transistor;
   the third transistor has a seventh common terminal, the seventh common terminal being connected to the third common terminal of the first transistor; and
   the fourth transistor has an eighth common terminal, the eighth common terminal being connected to the fourth common terminal of the second transistor.

9. An amplifier comprising:
   an input stage;
   an output stage comprising:
      a first transistor having a first input terminal; and
      a second transistor having a second input terminal;

a monitoring stage comprising:
- a first current sensing transistor having a third input terminal and a first common terminal, wherein the third input terminal is connected to the first input terminal and the first common terminal is connected to a first voltage rail; and
- a second current sensing transistor having an fourth input terminal and a second common terminal, wherein the fourth input terminal is connected to the second input terminal and the second common terminal is connected to a second voltage rail;

wherein a first current enters the first common terminal of the first current sensing transistor;

wherein a fourth current exits the second common terminal of the second current sensing transistor;

wherein the fourth current and the first current sum to a third current having a constant value.

10. The amplifier of claim 9 wherein the monitoring stage further comprises a current source having an output, the output carrying the third current.

11. An amplifier comprising:

an input stage;

an output stage comprising:
- a first transistor having a first input terminal; and
- a second transistor having a second input terminal;

a monitoring stage comprising:
- a first current sensing transistor having a third input terminal and a first common terminal, wherein the third input terminal is connected to the first input terminal and the first common terminal is connected to a first voltage rail; and
- a second current sensing transistor having an fourth input terminal and a second common terminal, wherein the fourth input terminal is connected to the second input terminal and the second common terminal is connected to a second voltage rail;

wherein the output stage is a first output stage;

wherein the first output stage further comprises a first output;

wherein the amplifier further comprising: a second output stage having a second output;

wherein the first output and the second output comprise a differential output.

\* \* \* \* \*